(12) United States Patent
Yamazaki

(10) Patent No.: US 7,659,571 B2
(45) Date of Patent: Feb. 9, 2010

(54) SEMICONDUCTOR DEVICE AND METHOD FOR MANUFACTURING THE SAME

(75) Inventor: Yasushi Yamazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/445,236

(22) Filed: Jun. 2, 2006

(65) Prior Publication Data
US 2006/0273388 A1    Dec. 7, 2006

(30) Foreign Application Priority Data
Jun. 3, 2005    (JP) .............................. 2005-163575

(51) Int. Cl.
*H01L 29/94* (2006.01)

(52) U.S. Cl. .................. 257/330; 257/327; 257/328; 257/192; 257/E29.242

(58) Field of Classification Search ................. 257/330, 257/327–329, 192, E29.242
See application file for complete search history.

(56) References Cited

U.S. PATENT DOCUMENTS

| | | | |
|---|---|---|---|
| 5,270,257 A * | 12/1993 | Shin | ............................ 438/300 |
| 5,793,090 A | 8/1998 | Gardner et al. | |
| 6,177,319 B1 | 1/2001 | Chen | |
| 6,274,894 B1 * | 8/2001 | Wieczorek et al. | ........... 257/192 |
| 2006/0094194 A1 * | 5/2006 | Chen et al. | ................... 438/301 |

FOREIGN PATENT DOCUMENTS

| | | |
|---|---|---|
| JP | 2004-095962 A | 3/2004 |
| JP | 3640945 B | 1/2005 |
| JP | 2005-039270 A | 2/2005 |
| KR | 2004-0060119 | 7/2004 |
| KR | 2004-0060119 A | 7/2004 |
| KR | 20040060119 * | 7/2004 |

OTHER PUBLICATIONS

Taiwanese Office Action, w/ English translation thereof, issued in Taiwanese Patent Application No. 095119540 dated Aug. 14, 2008.
Chinese Office Action, w/ English translation thereof, issued in Chinese Patent Application No. 2006100930152 dated on Aug. 22, 2008.

* cited by examiner

*Primary Examiner*—Cuong Q Nguyen
*Assistant Examiner*—Trang Q Tran
(74) *Attorney, Agent, or Firm*—McDermott Will & Emery LLP

(57) ABSTRACT

A semiconductor device is provide with a semiconductor substrate, a groove formed in the semiconductor substrate, a gate insulting film formed on the inner wall of the groove, a gate electrode formed in the groove, and a source/drain region and an LDD region arranged in the direction that is substantially orthogonal to the substrate surface of the semiconductor substrate.

8 Claims, 18 Drawing Sheets

SEMICONDUCTOR DEVICE AND METHOD FOR MANUFACTURING THE SAME

TECHNICAL FIELD

The present invention relates to a semiconductor device and to a method for manufacturing the same, and particularly relates to a method for manufacturing a semiconductor device having a trench-gate-type transistor.

BACKGROUND OF THE INVENTION

The recent miniaturization of DRAM (Dynamic Random Access Memory) cells has been accompanied by the necessity of shortening the gate length of access transistors (hereinafter referred to as cell transistors) in cell arrays. However, short channel effects in a transistor become more severe as the gate length is shortened, and drawbacks occur whereby the threshold voltage (Vt) of the transistor is reduced by increased sub-threshold current. When the impurity concentration in the substrate is increased in order to minimize the decrease in Vt, deterioration of the refresh characteristics in the DRAM becomes a severe drawback because of increased junction leakage.

A so-called trench-gate-type transistor (also referred to as a recess channel transistor) in which a gate electrode is embedded in a groove formed on a silicon substrate has been emphasized as a means of overcoming these drawbacks (see Japanese Laid-open Patent Application Nos. 2005-39270 and 2004-95962). Using a trench-gate-type transistor, the effective channel length (gate length) can be physically and adequately maintained, and it is possible to create precision DRAM having a minimum workable dimension of 90 nm or less.

FIG. 16 is a schematic cross sectional view showing an example of the structure of the conventional trench-gate-type transistor. In the cell transistor shown in FIG. 16, a groove (gate trench) 203 is formed in a silicon substrate 201 having an STI (Shallow Trench Isolation) or other element separation region 202, a gate oxide film 204 is formed on the inner wall of this gate trench 203, and a gate electrode 205 is also formed inside the gate trench 203. The gate electrode 205 is composed of a polysilicon film 205*a* and a silicide layer (or metal film) 205*b* formed on the polysilicon film 205*a*, and a high impurity concentration N-type diffusion layer (source/drain region) 206 is formed on both sides of the gate electrode 205 via the gate oxide film 204.

FIG. 17 is a schematic cross sectional view showing another example of the structure of the conventional trench-gate-type transistor. The cell transistor shown in FIG. 17 has an LDD (Lightly Dosed Drain) structure. Specifically, a side wall insulating film 207 is formed on the side surface of the portion of the gate electrode 205 that protrudes from the surface of the silicon substrate 201, wherein the gate electrode is composed of the polysilicon film 205*a* and the silicide layer (or metal film) 205*b* formed thereon; a low impurity concentration N-type diffusion layer (LDD region) 208 is formed in the region adjacent to the gate oxide film 204 under the side wall insulating film 207; and a high impurity concentration N-type diffusion layer (source/drain region) 206 is formed in a position that is separated from the gate oxide film 204 by a distance commensurate with the thickness of the side wall insulating film 207.

In the conventional cell transistor structure shown in FIG. 16, the insulation between the gate electrode 205 of the cell transistor and the high impurity concentration N-type diffusion layer (source/drain region) 206 is provided only by the gate insulating film 204. This structure therefore has drawbacks in that defects in electric breakdown resistance can easily occur in the portion P1 in which the aforementioned components are in proximity with each other. In contrast, in the cell transistor structure shown in FIG. 17, not only the gate insulating film 204 but also the low impurity concentration N-type diffusion layer 208 are interposed between the gate electrode 205 and the source/drain region 206. The electric field between the aforementioned components is therefore weakened, and the drawback of inadequate electric breakdown resistance can be overcome. However, even when an LDD structure is employed, fluctuation in transistor characteristics, such as threshold voltage (Vt) or ON current, increases significantly if the gate trench 203 and the gate electrode 205 are misaligned with respect to each other as shown in FIG. 18. The high impurity concentration N-type diffusion layer 206 and the gate electrode 205 also approach each other on one side P2 of the gate electrode 205, causing the drawback of electric breakdown resistance defects to reappear. Furthermore, since the length of the low impurity concentration N-type diffusion layer 208 directly affects the connecting electric field of the cell node, the presence of a misaligned cell transistor causes drawbacks whereby the connecting electric field intensity increases for a portion of the bits, and the information retaining characteristics (tREF characteristics) of the DRAM are severely compromised.

SUMMARY OF THE INVENTION

The present invention was developed in order to overcome the drawbacks described above, and an object of the present invention is to provide a semiconductor device having a trench-gate-type transistor that is free of electric breakdown resistance defects between the gate electrode and the source/drain region, and that has satisfactory characteristics.

Another object of the present invention is to provide a method for manufacturing a semiconductor device having a trench-gate-type transistor that is free of electric breakdown resistance defects between the gate electrode and the source/drain region, and that has satisfactory characteristics.

The above and other object of the present invention can be accomplished by a semiconductor device comprising a semiconductor substrate, a groove formed in the semiconductor substrate, a gate insulating film formed on the inner wall of the groove, a gate electrode having a first portion formed on the gate insulating film in the groove and a second portion that protrudes from the surface of the semiconductor substrate, a side wall insulating film for covering the lateral face of the second portion of the gate electrode, an epitaxial layer formed on the semiconductor substrate adjacent to the side wall insulating film, and a source/drain region formed in at least a portion of the epitaxial layer.

According to the present invention, since the side wall insulating film is present between the gate electrode and the source/drain region, the electric field between the gate electrode and the source/drain region is weakened, and electric breakdown resistance defects are minimized. It is therefore possible to provide a high-performance semiconductor device.

In a preferred aspect of the present invention, the bottom layer of the source/drain region comprises an LDD region.

In a preferred aspect of the present invention, the epitaxial layer comprises two impurity diffusion layers that include an upper layer and a lower layer. The upper layer of the epitaxial layer comprises the source/drain region, and the lower layer thereof comprises a first LDD region. A second LDD region in contact with the first LDD region is formed near the surface of the semiconductor substrate.

In another preferred aspect of the present invention, the entire epitaxial layer comprises the source/drain region. The LDD region in contact with the source/drain region is formed near the surface of the semiconductor substrate.

In a further preferred aspect of the present invention, a gate insulating film is formed under the side wall insulating film.

The above and other object of the present invention can be accomplished by a method for manufacturing a semiconductor device comprising the steps of forming a groove in a semiconductor substrate, forming a gate insulting film in the inner wall of the groove, forming a gate electrode that comprises a first portion formed on the gate insulating film in the groove and a second portion that protrudes further than the surface of the semiconductor substrate, forming a side wall insulating film for covering the lateral surface of the second portion of the gate electrode, forming an epitaxial layer on the semiconductor substrate so as to be adjacent to the side wall insulating film, and forming a source/drain region in at least a portion of the epitaxial layer.

In a preferred aspect of the present invention, the method for manufacturing a semiconductor device further comprises a step of forming an LDD region in the lower layer of the source/drain region prior to the step of forming the source/drain region.

In a preferred aspect of the present invention, the method for manufacturing a semiconductor device further comprises a step of forming a first LDD region in the lower layer of the epitaxial layer prior to the step for forming the source/drain region, wherein the step for forming the source/drain region is a step for forming the source/drain region in the upper layer of the epitaxial layer.

In a preferred aspect of the present invention, the method for manufacturing a semiconductor device further comprises a step of forming a second LDD region in contact with the first LDD region near the surface of the semiconductor substrate prior to the step for forming the epitaxial layer.

In another preferred aspect of the present invention, the step of forming the source/drain region is a step of forming the source/drain region in the entire epitaxial layer.

In a preferred aspect of the present invention, the method for manufacturing a semiconductor device further comprises a step of forming the LDD region in contact with the source/drain region near the surface of the semiconductor substrate prior to the step for forming the epitaxial layer.

In a preferred aspect of the present invention, the step of forming the gate insulating film includes a step of forming a gate insulating film under the side wall insulating film.

In a preferred aspect of the present invention, the step of forming the groove comprises the steps of forming a protective insulating film on the semiconductor substrate, forming a prescribed opening pattern in the protective insulating film, and forming a groove in the semiconductor substrate using the protective insulating film as a mask. The step for forming the gate electrode also comprises the steps of filling the inside of the groove and the inside of the opening pattern with an electrode material, removing the unnecessary portion of the electrode material on the protective insulating film, and removing the protective insulating film.

In a preferred aspect of the present invention, the step of forming the gate electrode comprises the steps of filling the inside of the groove with a polysilicon film and forming a silicide layer in the surface layer portion of the polysilicon film by forming a refractory metal film on the surface of the polysilicon film and reacting the refractory metal film with the polysilicon film.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Preferred embodiments of the present invention applied to a DRAM cell transistor will now be described in detail hereinafter with reference to the accompanying drawings.

FIGS. 1 through 8 are schematic cross sectional views showing the process for manufacturing DRAM according to a first embodiment of the present invention.

Figure 1A:
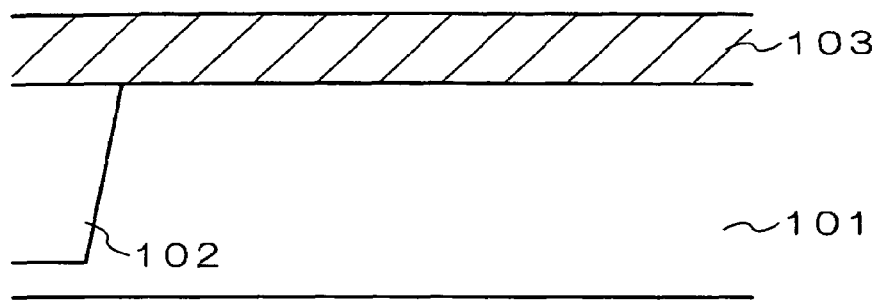
FIGS. 1A to 1C are schematic cross sectional views showing the process for manufacturing DRAM (Specifically forming a gate trench 104) according to a first embodiment of the present invention.
Figure 1B:
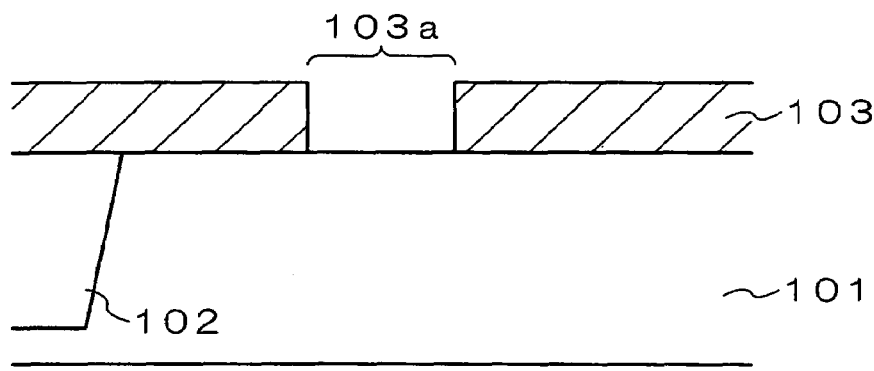
Figure 1C:
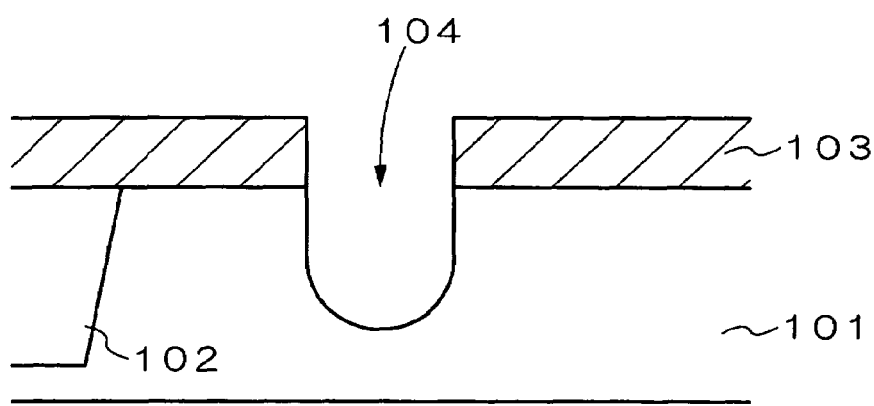

In the DRAM manufacturing process according to the present embodiment, an element separation region 102 having a depth of about 250 to 350 nm is first formed by an STI method on a P-type silicon substrate 101, after which a protective insulating film is formed on the surface of the silicon substrate 101 as shown in FIG. 1A. Specifically, a silicon nitride film 103 having a thickness of about 100 to 200 nm is deposited by CVD (Chemical Vapor Deposition). An opening pattern 103a is then formed in the silicon nitride film 103 by photolithography to selectively remove the silicon nitride film 103 in the prescribed region in which the gate electrode is to be formed, as shown in FIG. 1B. A groove (gate trench) 104 having a depth of about 100 to 200 nm is then formed as shown in FIG. 1C by dry-etching the silicon substrate 101 using the silicon nitride film 103 as a mask.

Figure 2:
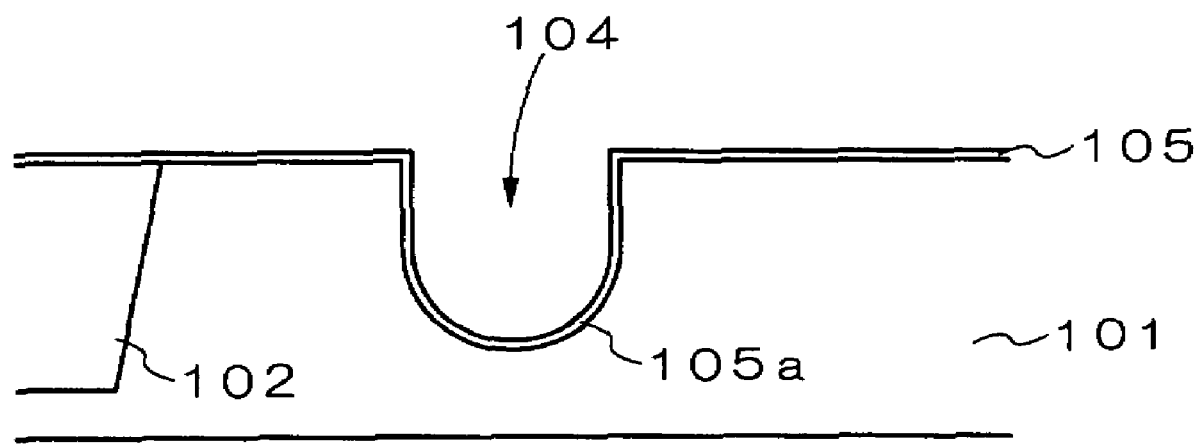
FIG. 2 is a schematic cross sectional view showing the process for manufacturing DRAM (Specifically forming a silicon oxide film 105) according to the first embodiment of the present invention.

As shown in FIG. 2, after the silicon nitride film 103 is removed, a silicon oxide film 105 having a thickness of about 6 to 8 nm is then formed by thermal oxidation on the entire surface of the silicon substrate 101, including the inner wall of the gate trench 104. A state is thereby produced in which a gate insulating film 105a is formed on the inner wall of the gate trench 104. The threshold voltage Vt of the transistor herein is preferably adjusted by the channel doping of the inside of the gate trench 104 prior to the formation of the gate insulating film 105a.

Figure 3A:
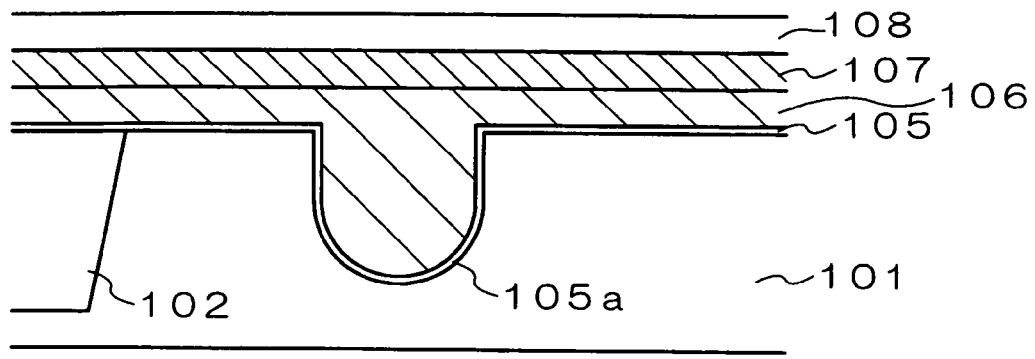
FIGS. 3A to 3C are schematic cross sectional views showing the process for manufacturing DRAM (Specifically forming a gate electrode 109) according to the first embodiment of the present invention.
Figure 3B:
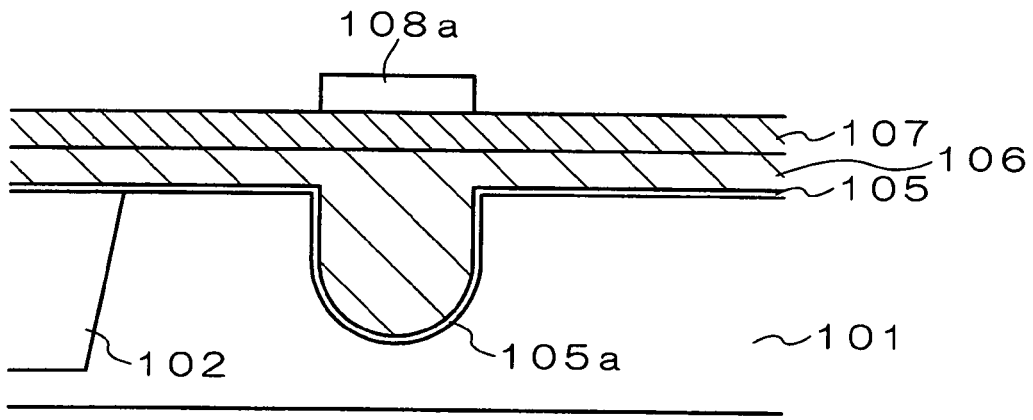
Figure 3C:
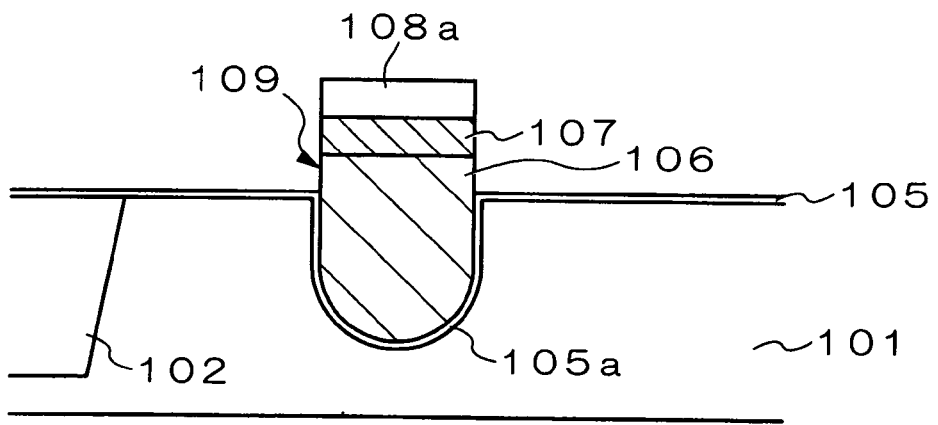

As shown in FIG. 3A, a polysilicon film (doped polysilicon film) 106 doped with phosphorus (P), arsenic (As), or another N-type impurity is then deposited by CVD onto the entire surface of the silicon oxide film 105, including the inside of the gate trench 104. A refractory metal film 107 composed of tungsten (W) (preferably a laminate film in which WSi, WN, and W are deposited in this sequence), cobalt (Co), titanium (Ti), or nickel (Ni) is then deposited by sputtering on the surface of the polysilicon film 106, and a silicon nitride film 108 is furthermore deposited by CVD on the surface thereof. A gate cap insulating film 108a having a thickness of about 20 nm is formed on the gate trench 104 by patterning the silicon nitride film 108 by using photolithography, as shown in FIG. 3B. A gate electrode 109 composed of the polysilicon film 106 and the refractory metal film 107 is then completed by patterning the polysilicon film 106 and the refractory metal film 107 using the gate cap insulating film 108a as a mask, as shown in FIG. 3C.

Figure 4:
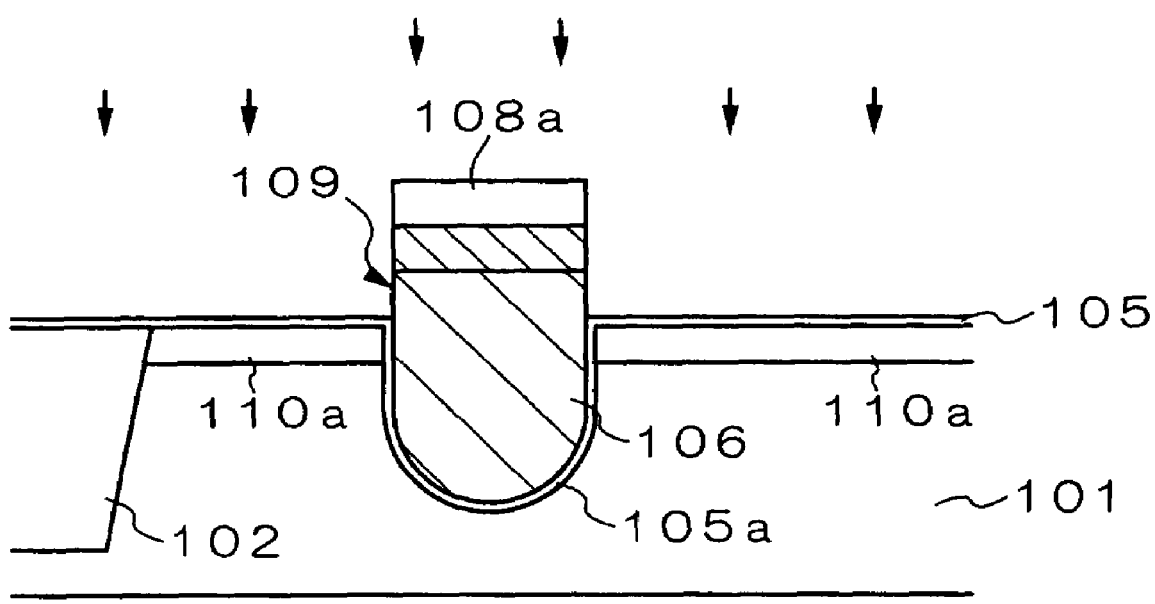
FIG. 4 is a schematic cross sectional view showing the process for manufacturing DRAM (Specifically forming a low impurity concentration N-type diffusion layer 110a) according to the first embodiment of the present invention.

As shown in FIG. 4, a low impurity concentration N-type diffusion layer 110a that serves as the LDD region of the transistor is then formed by the ion implantation of about $5 \times 10^{12}$ to $1 \times 10^{14}$ cm$^{-2}$ of phosphorus (P) at an implantation energy of 10 to 40 keV into the silicon substrate 101, or the ion implantation of about $5 \times 10^{12}$ to $1 \times 10^{14}$ cm$^{-2}$ of arsenic (As) at an implantation energy of 10 to 60 keV into the silicon substrate 101, via the silicon oxide film 105 formed on the surface of the silicon substrate 101.

Figure 5A:
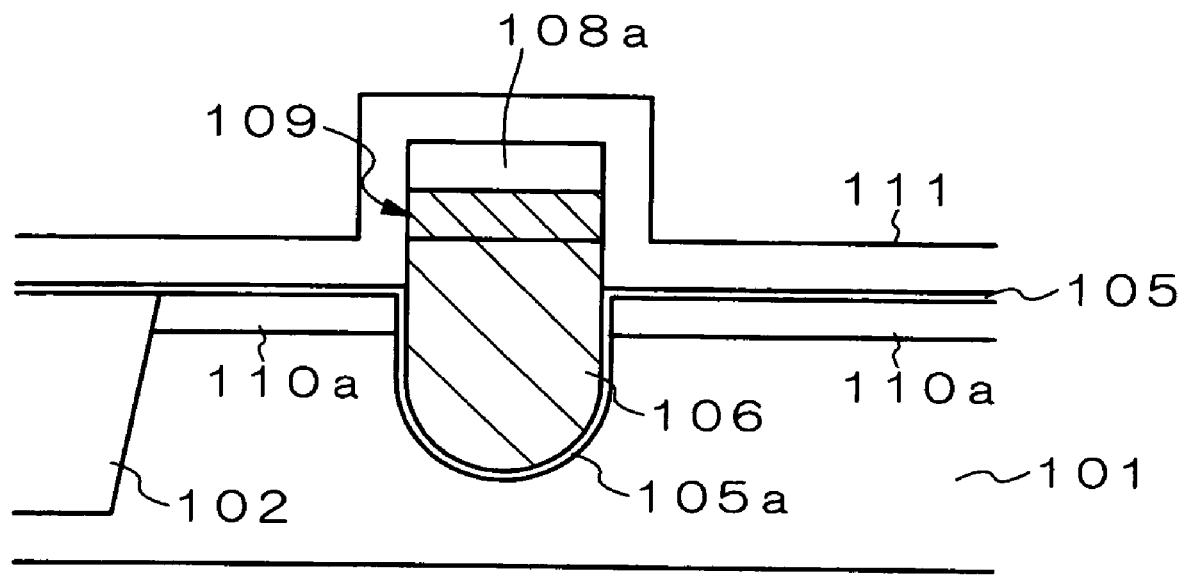
FIGS. 5A and 5B are schematic cross sectional views showing the process for manufacturing DRAM (Specifically forming a side wall insulating film 111a) according to the first embodiment of the present invention.
Figure 5B:
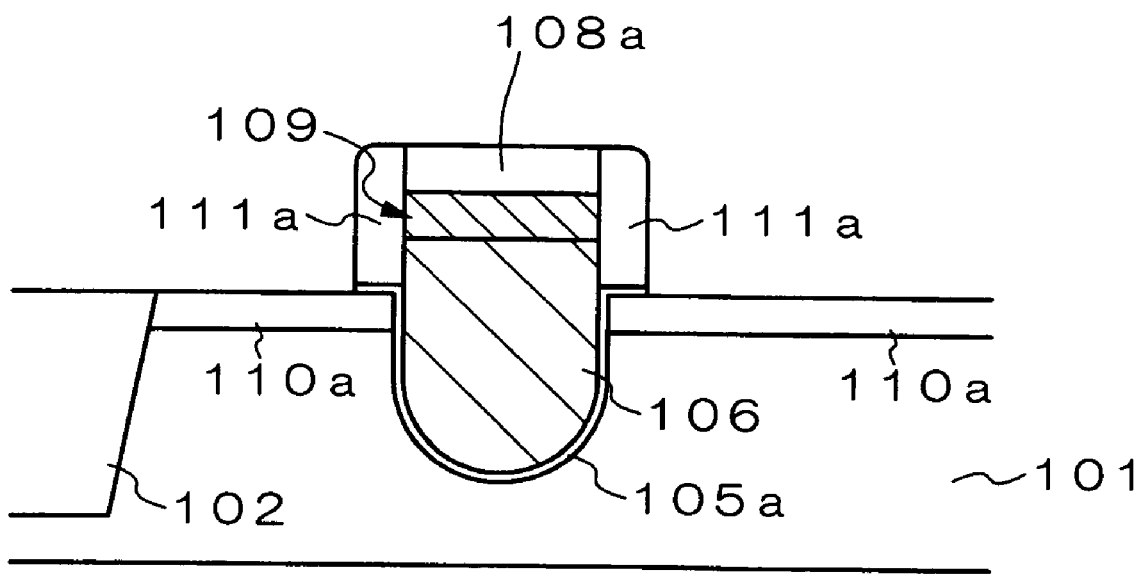

Then, after a new silicon nitride film 111 is deposited on the entire surface of the substrate as shown in FIG. 5A, the silicon nitride film 111 is etched back so as to remain only on the lateral surface portion of the gate electrode 109 and gate cap insulating film 108a as shown in FIG. 5B, and a side wall insulating film 111a is formed. The silicon oxide film 105 on the surface portion of the silicon substrate 101 is also removed by the etchback.

Figure 6:
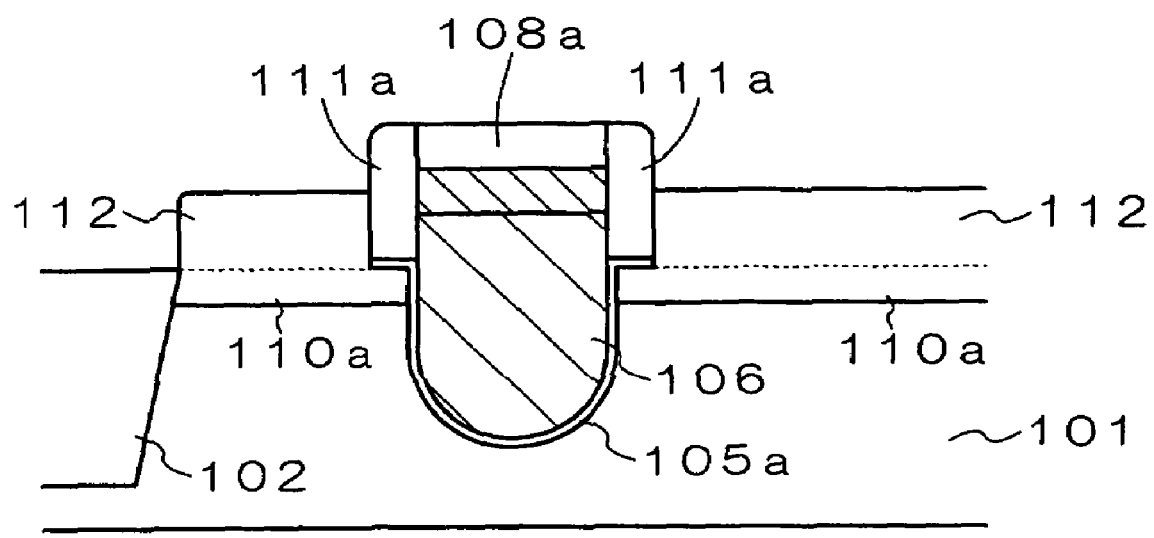
FIG. 6 is a schematic cross sectional view showing the process for manufacturing DRAM (Specifically forming a silicon epitaxial layer 112) according to the first embodiment of the present invention.

A silicon epitaxial layer 112 is then formed by selective epitaxial growth (SEG) adjacent to the side wall insulating film 111a in the region in which the low impurity concentration N-type diffusion layer 110a is formed, as shown in FIG. 6. The low impurity concentration N-type diffusion layer 110a is doped with phosphorus (P) or arsenic (As), but these impurities have no particular effect on the epitaxial growth. The silicon epitaxial layer 112 is thus banked up on the low impurity concentration N-type diffusion layer 110a. The height of the silicon epitaxial layer 112 is preferably about 50 to 100 nm. The silicon epitaxial layer 112 is grown free of impurities (non-doped) in the present embodiment, but may also be grown doped with phosphorus (P), arsenic (As), or other impurities.

Figure 7A:
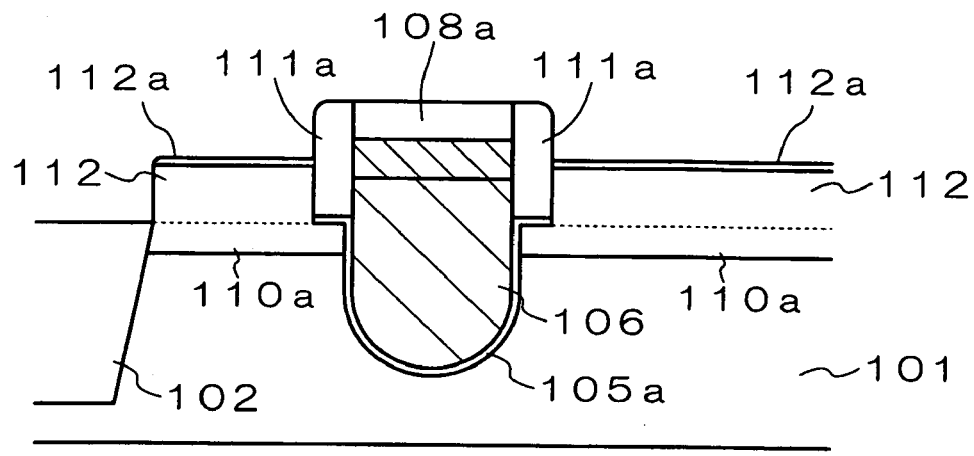
FIGS. 7A and 7B are schematic cross sectional views showing the process for manufacturing DRAM (Specifically forming a low impurity concentration N-type diffusion layer 110b and a high impurity concentration N-type diffusion layer 113) according to the first embodiment of the present invention.
Figure 7B:
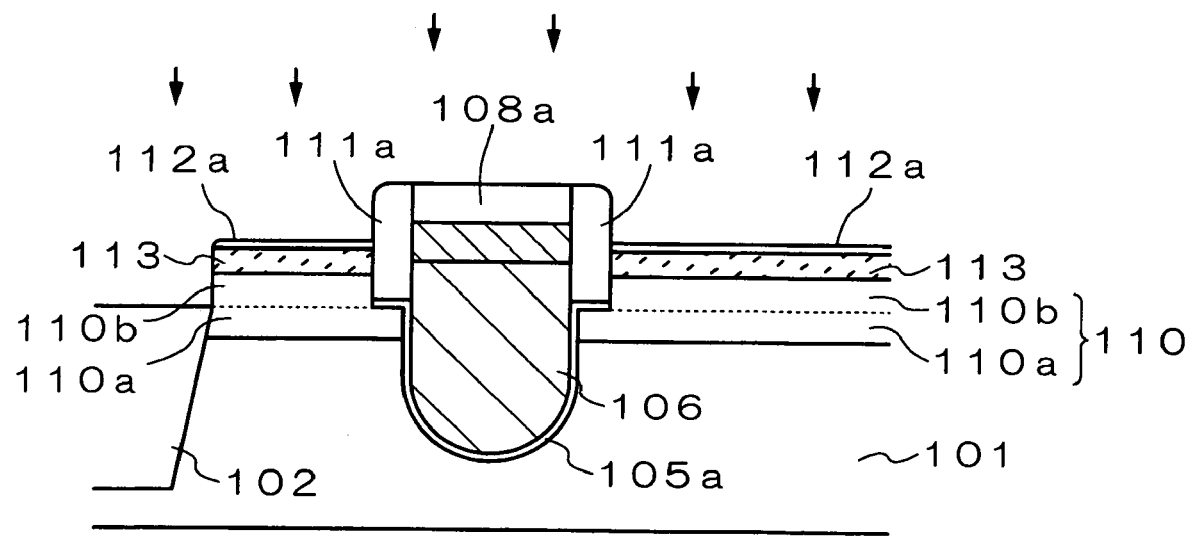

Next, a thin silicon oxide film 112a is formed on the surface of the silicon epitaxial layer 112 by thermal oxidation, as shown in FIG. 7A. A low impurity concentration N-type diffusion layer 110b is then formed by the ion implantation of about $5 \times 10^{12}$ to $1 \times 10^{14}$ cm$^{-2}$ of phosphorus (P) at an implantation energy of 10 to 40 keV into the silicon epitaxial layer 112, or the ion implantation of about $5 \times 10^{12}$ to $1 \times 10^{14}$ cm$^{-2}$ of arsenic (As) at an implantation energy of 10 to 60 keV into the silicon epitaxial layer 112, via the silicon oxide film 112a as shown in FIG. 7B. Furthermore, a high impurity concentration N-type diffusion layer 113 that serves as the source/drain region of the cell transistor is formed in the upper layer of the silicon epitaxial layer 112 by the ion implantation of about $5 \times 10^{13}$ to $5 \times 10^{15}$ cm$^{-2}$ of arsenic (As) is implanted as ions at an implantation energy of 10 to 40 keV and annealing for about one minute at 800° C. to 1,000° C.

The high impurity concentration N-type diffusion layer 113 thus formed is positioned so as to be aligned against the side of the side wall insulating film 111a, and is structured so that the side wall insulating film 111a provides insulation between the high impurity concentration diffusion layer 113 and the gate insulating film 105a. The thickness of the side wall insulating film 111a in the width direction thereof is about 20 nm, which is adequate relative to the gate insulating film 105a, and the high impurity concentration diffusion layer 113 and the gate insulating film 105a are also adequately separated from each other in the vertical direction. Therefore, the risk of electric breakdown resistance defects is extremely low. The low impurity concentration N-type diffusion layer 110b on the side of the silicon epitaxial layer 112 and the low impurity concentration N-type diffusion layer 110a on the side of the silicon substrate 101 have substantially the same concentration of impurities, whereby an LDD region 110 is formed in which the low impurity concentration N-type diffusion layer 110b is the first LDD region, and the low impurity concentration diffusion layer 110a is the second LDD region. Specifically, a structure is created in which the source/drain region 113, the LDD region 110, and the channel region are arranged in the longitudinal direction (the direction substantially orthogonal to the substrate surface of the silicon substrate 101).

The trench-gate-type transistor of the present embodiment is thus completed.

Figure 8:
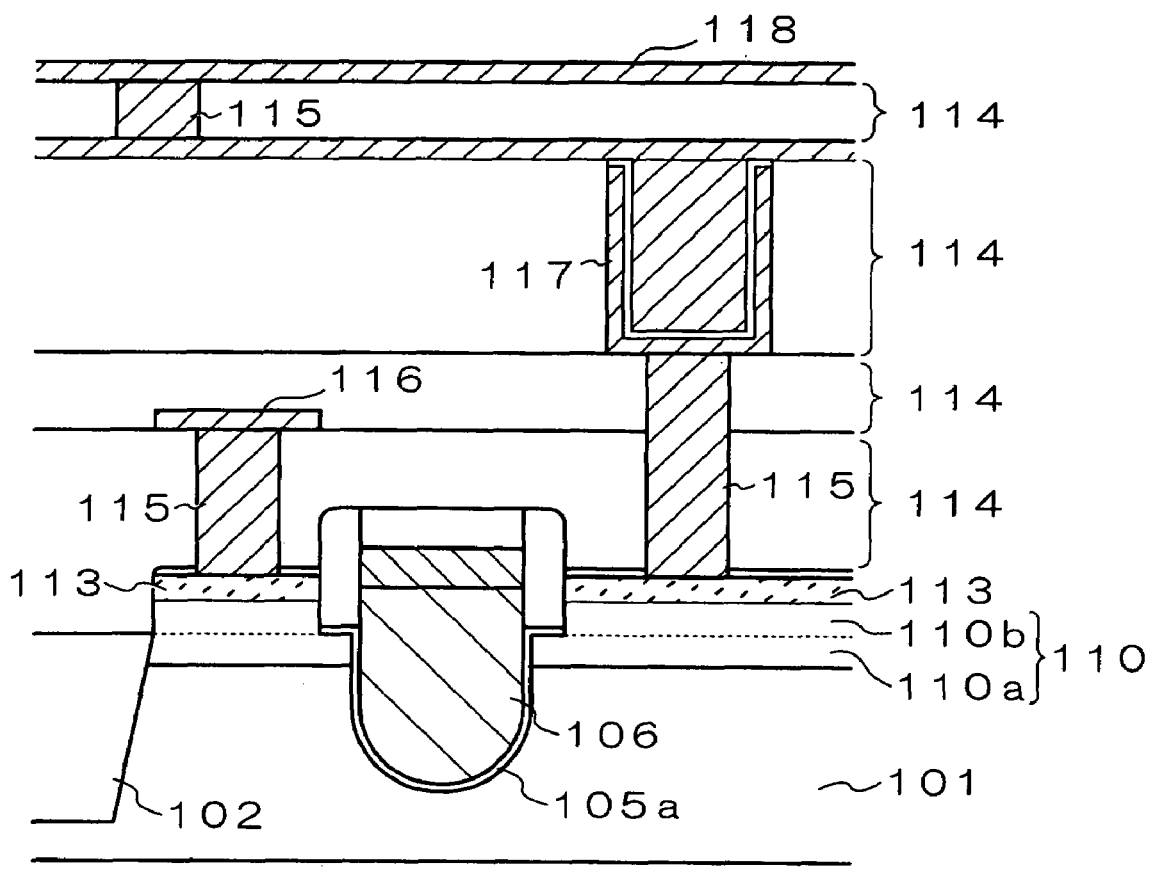
FIG. 8 is a schematic cross sectional view showing the process for manufacturing DRAM (Specifically forming various types of wiring and cell capacitors) according to the first embodiment of the present invention.

Various types of wiring and cell capacitors are then layered using a common method in DRAM manufacturing. Specifically, DRAM having a trench-gate-type cell transistor is completed by forming an interlayer insulating film 114 on the cell transistor, and a contact plug 115 that pass through the interlayer insulating film 114, a bit line 116, a cell capacitor 117, Al wiring 118, and other components are formed as shown in FIG. 8.

As described above, since the high impurity concentration diffusion layer 113 that serves as the source/drain region of the cell transistor is formed so as to be aligned against the side wall insulating film 111a, and is adequately separated from the gate insulating film 105a according to the present embodiment, junction leakage can be prevented, and a recess channel transistor having good characteristics can be manufactured. It is therefore possible to manufacture high-quality and high-density DRAM by using this product as a DRAM cell transistor.

Figure 9:
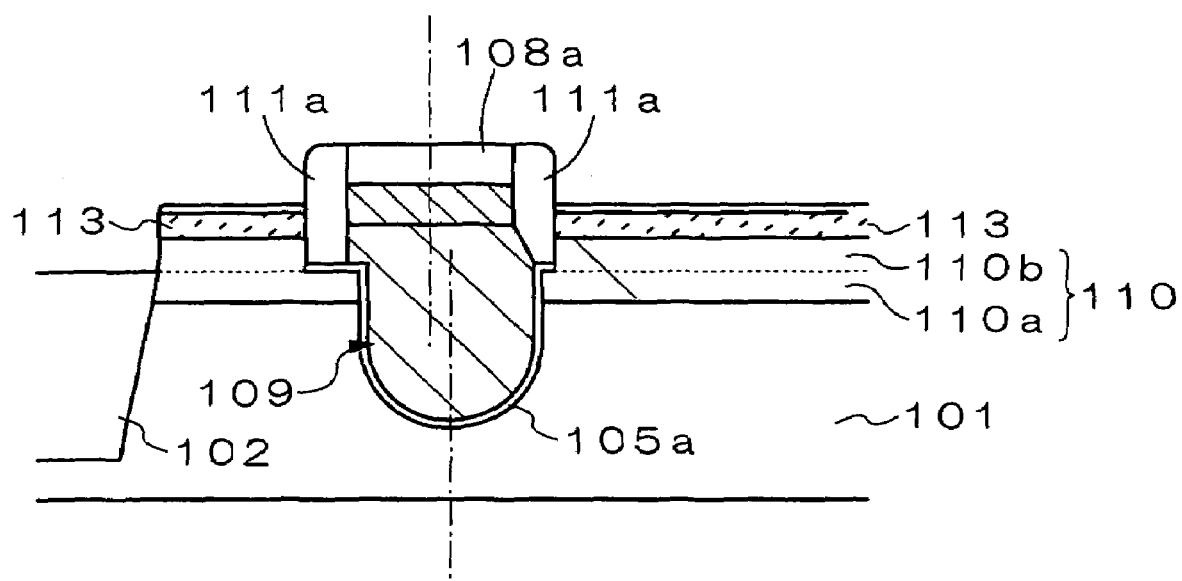
FIG. 9 is a schematic cross sectional view showing the structure of the cell transistor in which the entire gate electrode 109 is misaligned.

When misalignment of the gate cap insulating film 108a with respect to the gate trench 104 occurs in the step shown in FIG. 3B for patterning the silicon nitride film 108 and forming the gate cap insulating film 108a, the entire gate electrode 109 will be misaligned, as shown in FIG. 9. Even in such a case, however, no severe fluctuation occurs in transistor characteristics, such as threshold voltage (Vt) or ON current, since the high impurity concentration diffusion layers 113 on the left and right are adequately separated in the vertical direction from the gate insulating film 105a.

Figure 10:
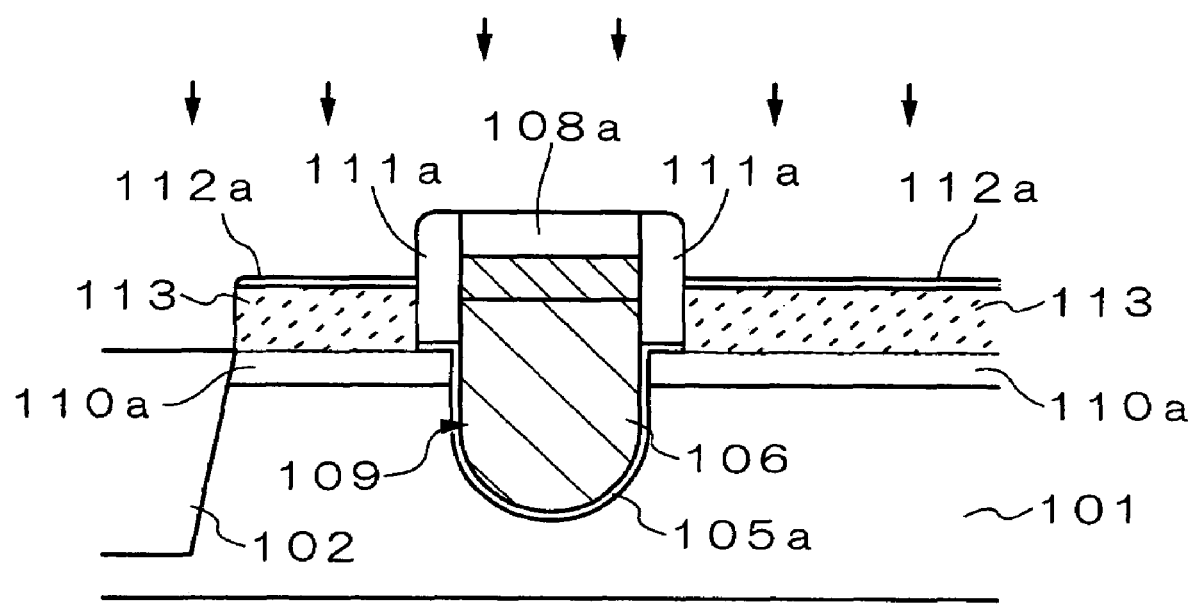
FIG. 10 is a schematic cross sectional view showing the structure of the cell transistor in which the entire silicon epitaxial layer 112 is made into the high impurity concentration N-type diffusion layer 113.

In the embodiment described above, the high impurity concentration N-type diffusion layer 113 that serves as the source/drain region of the cell transistor is formed in the upper layer of the silicon epitaxial layer 112, and the bottom layer of the silicon epitaxial layer 112 is the low impurity concentration N-type diffusion layer 110b, as shown in FIG. 7B. However, the entire silicon epitaxial layer 112 may be made into the high impurity concentration N-type diffusion layer 113, as shown in FIG. 10. In this case, after a thin silicon oxide film 112a is formed, as shown in FIG. 7A, about $5 \times 10^{13}$ to $5 \times 10^{15}$ cm$^{-2}$ of phosphorus (P) or arsenic (As) is implanted as ions at an implantation energy of 20 to 50 keV into the silicon epitaxial layer 112, and the product is then annealed for about one minute at 800° C. to 1,000° C., whereby the entire silicon epitaxial layer 112 is made into the high impurity concentration N-type diffusion layer 113. The high impurity concentration N-type diffusion layer 113 thus formed is also aligned against the side wall insulating film 111a, and a structure is formed in which the high impurity concentration diffusion layer 113 and the gate electrode 109 are insulated from each other by the side wall insulating film 111a.

Figure 11:
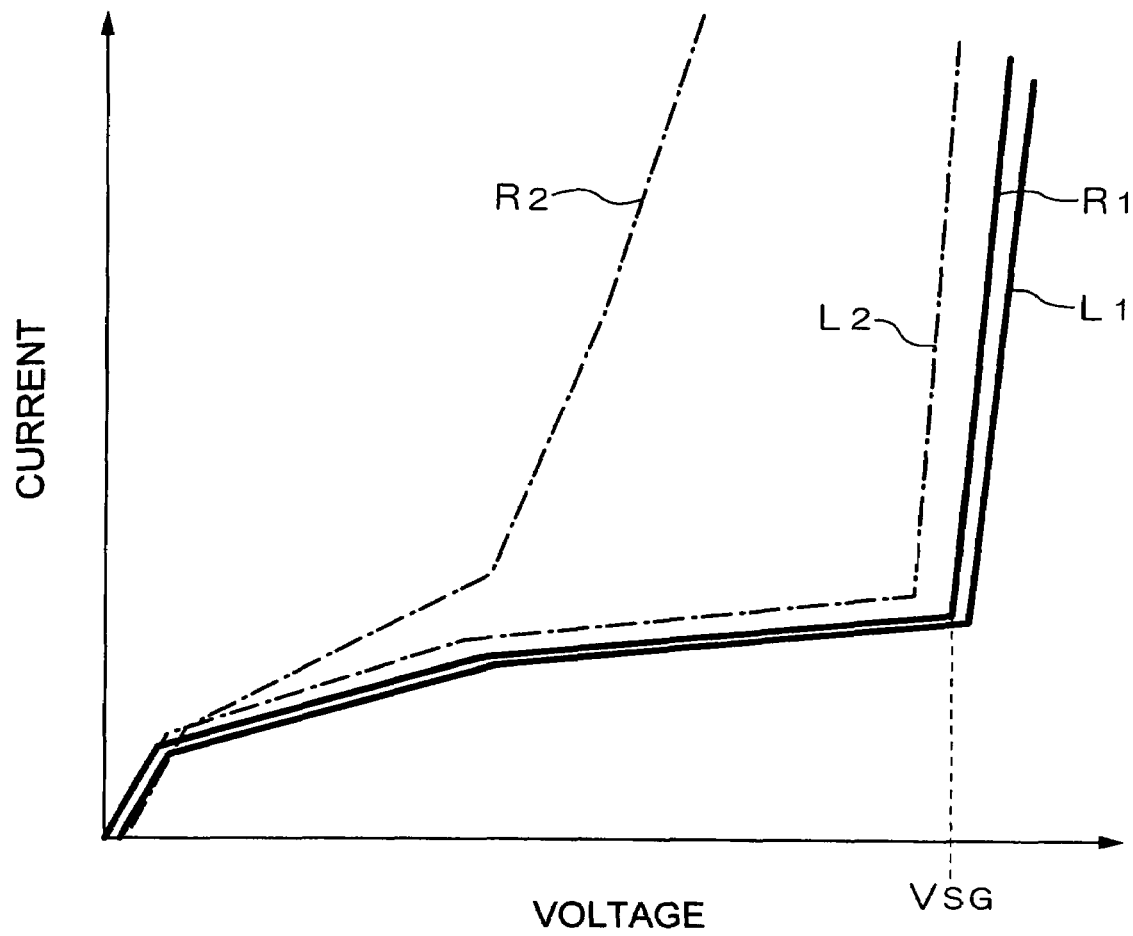
FIG. 11 is a graph showing the current characteristics of a cell transistor in which the gate electrode is misaligned.
Figure 18:
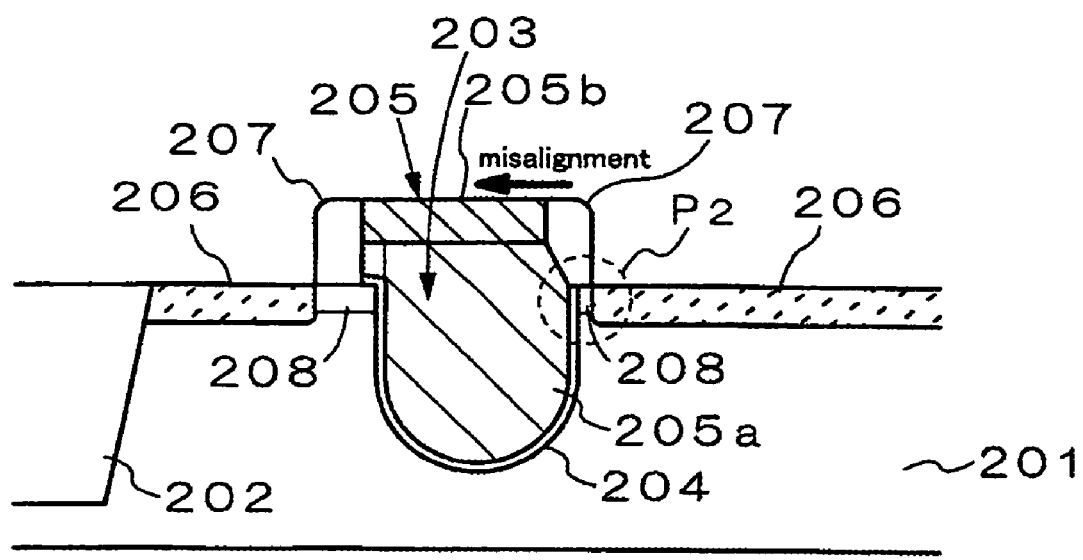
FIG. 18 is a schematic cross sectional view showing the structure of the conventional cell transistor in which the entire gate electrode 109 is misaligned.

FIG. 11 is a graph showing the current characteristics of a cell transistor in which the gate electrode is misaligned (wherein the gate electrode is offset to the left with respect to the gate trench as shown in FIG. 9). In FIG. 11, the gate-source voltage ($V_{GS}$) is plotted on the horizontal axis, and the gate-source current ($I_{GS}$) is plotted on the vertical axis. The solid lines in FIG. 11 indicate the voltage-current characteristics of a cell transistor manufactured according to the manufacturing method of the present embodiment. Solid line L1 indicates the current characteristics between the gate and source when the source/drain region to the left of the gate electrode is operated as the source, and solid line R1 indicates current characteristics between the gate and source when the source/drain region to the right of the gate electrode is operated as the source. The dotted lines indicate the characteristics of the conventional cell transistor shown in FIG. 18. Dotted line L2 indicates the current characteristics between the gate and source when the source/drain region to the left of the gate electrode is operated as the source, and dotted line R2 indicates the current characteristics between the gate and source when the source/drain region to the right of the gate electrode is operated as the source.

As is apparent from FIG. 11, in the conventional cell transistor, the current characteristics between the source and the gate electrode on the left side indicated by dotted line L2 are not particularly poor, but the current characteristics between the source and gate electrode on the right side indicated by dotted line R2 are extremely poor. In contrast, there is no significant difference between the current characteristics on the left and right sides in the cell transistor of the present example, and adequate electric breakdown resistance is apparently obtained.

Another preferred embodiment of the present invention will next be described in detail.

Figure 17:
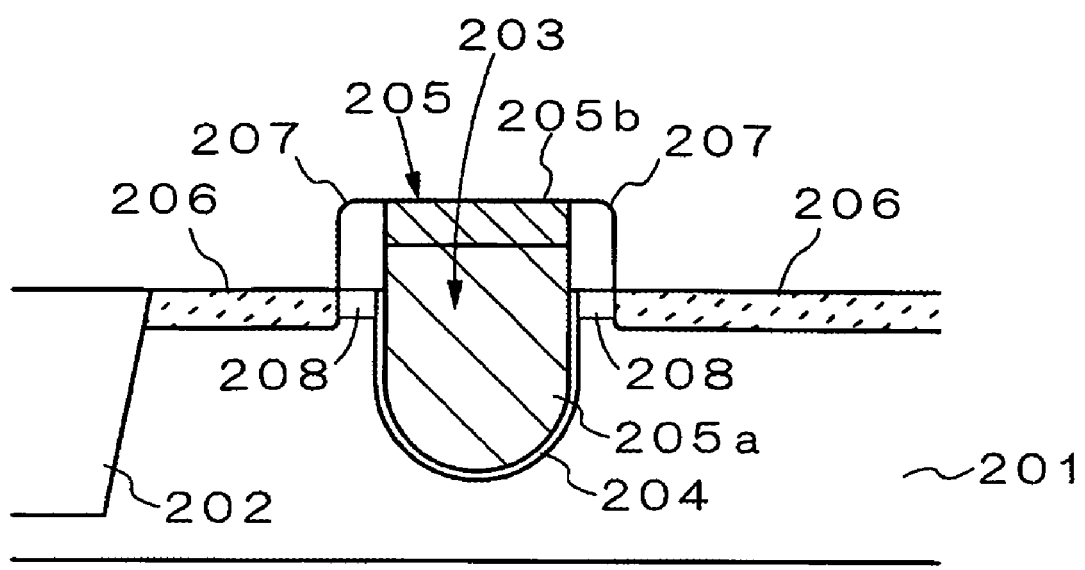
FIG. 17 is a schematic cross sectional view showing another example of the structure of the conventional trench-gate-type transistor.

FIGS. 12 through 15 are schematic cross sectional views showing some of the process for manufacturing DRAM according to a second embodiment of the present invention. The second embodiment is an example in which the gate electrode is formed so as to be self-matching (self-aligning) with respect to the gate trench. No misalignment occurs between the groove and the gate electrode when the gate electrode is formed in self-aligning fashion. Therefore, the source/drain regions on both sides of the gate electrode can be placed at a distance from the gate oxide film, and an decrease in electric breakdown resistance between the gate electrode and the source/drain region can be prevented by the formation of the side wall insulating film and the LDD region according to the conventional technique shown in FIG. 17. However, since further miniaturization requires that the side wall insulating film also be made as thin as possible, having such a thin side wall insulating film can cause the electric breakdown resistance to be inadequately maintained. The present invention is therefore also effective in a structure in which misalignment does not occur.

In the DRAM manufacturing process in the present embodiment, as shown in FIGS. 1A through 1C, an element separation region 102 having a depth of about 250 to 350 nm is first formed by an STI method on a P-type silicon substrate 101, after which a silicon nitride film 103 having a thickness of about 100 to 200 nm is deposited on the surface of the silicon substrate 101 by CVD. An opening pattern 103a is then formed in the silicon nitride film 103 by photolithography to selectively remove the silicon nitride film 103 in the prescribed region in which the gate electrode is to be formed. A groove (gate trench) 104 having a depth of about 100 to 200 nm is then formed by dry-etching the silicon substrate 101, using the silicon nitride film 103 as a mask. The process described above is the same as in the first embodiment.

Figure 12:
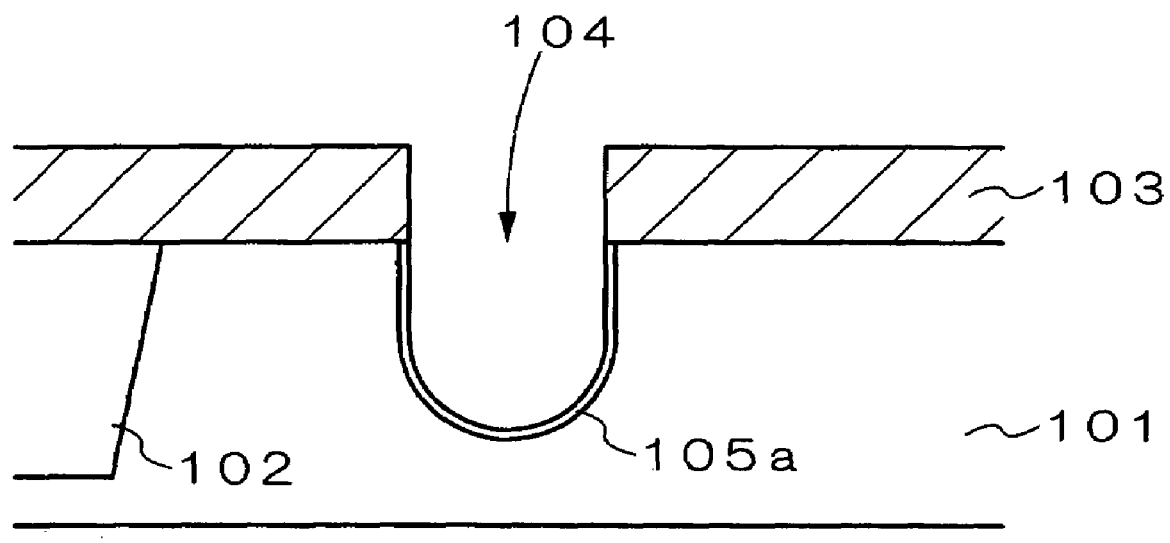
FIG. 12 is a schematic cross sectional view showing the process for manufacturing DRAM (Specifically forming a gate trench 104) according to a second embodiment of the present invention.

As shown in FIG. 12, rather than being removed, the silicon nitride film 103 is used as a mask without being modified to form the gate insulating film 105a having a thickness of about 6 to 8 nm by thermal oxidation on the inner wall surface of the gate trench 104. The threshold voltage Vt of the transistor is preferably adjusted by channel doping of the inside of the gate trench 104 prior to the formation of the gate insulating film 105a.

Figure 13A:
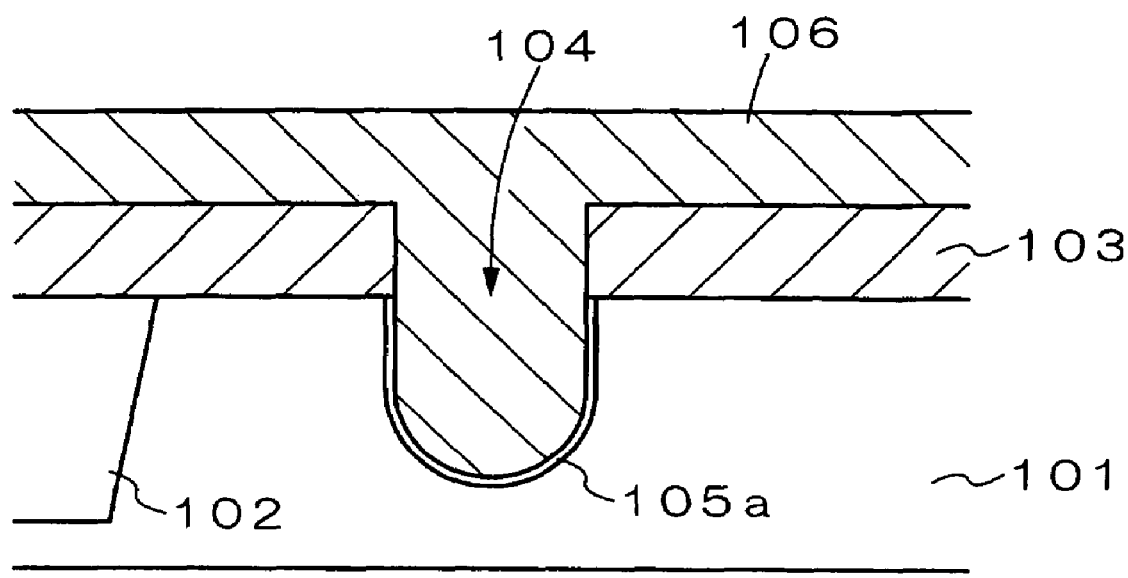
FIGS. 13A and 13B are schematic cross sectional views showing the process for manufacturing DRAM (Specifically forming a polysilicon film 106) according to the second embodiment of the present invention.
Figure 13B:
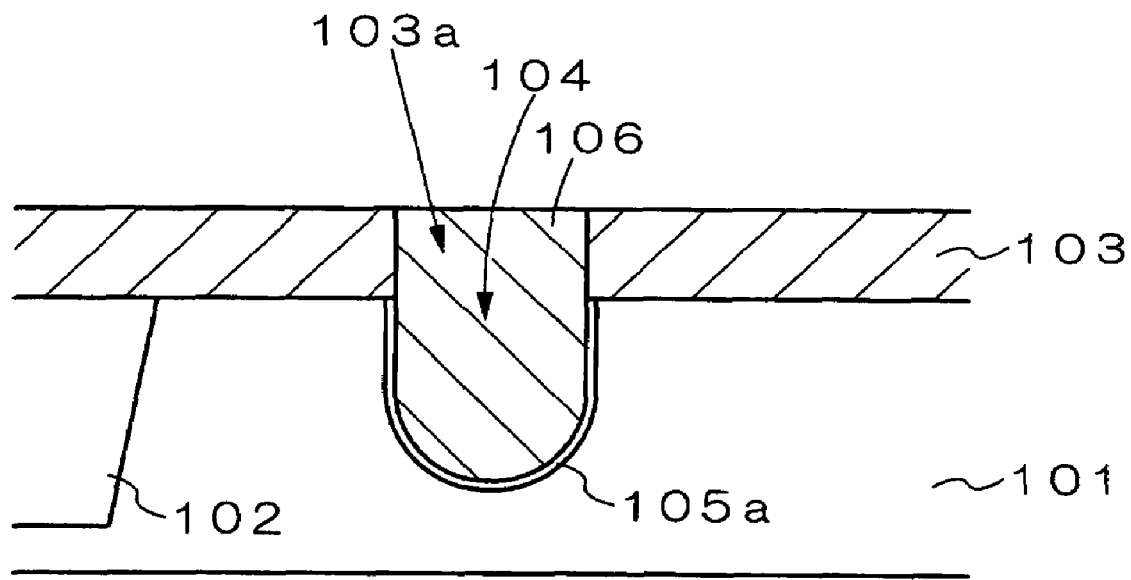

With the silicon nitride film 103 still remaining, a polysilicon film (doped polysilicon film) 106 doped with phosphorus (P), arsenic (As), or another N-type impurity is then deposited by CVD onto the entire surface of the silicon substrate 101, including the inside of the gate trench 104, as shown in FIG. 13A. As shown in FIG. 13B, the polysilicon film 106 is polished by CMP (chemical mechanical polishing) until the top surface of the silicon nitride film 103 is exposed, and the polysilicon film 106 is caused to remain in the gate trench 104 and in the opening pattern 103a of the silicon nitride film 103. At this time, since the silicon nitride film 103 serves as a barrier with respect to the CMP, it is possible to reliably remove only the unneeded portions of the polysilicon film 106, and adequate surface flatness can be maintained.

Figure 14A:
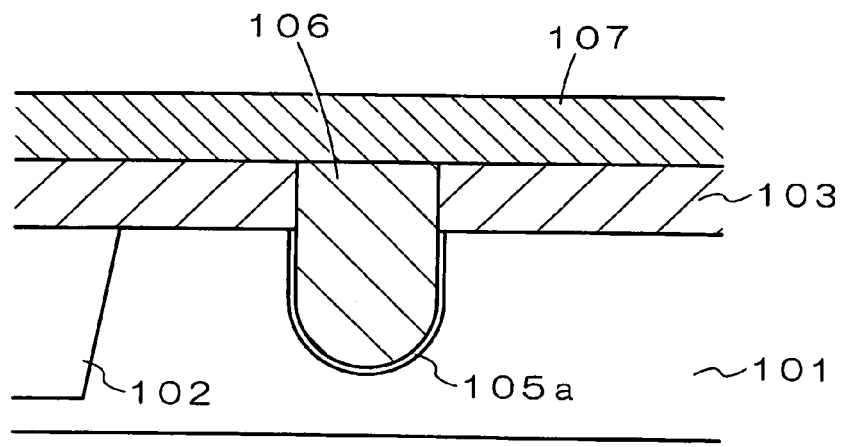
FIGS. 14A to 14C are schematic cross sectional views showing the process for manufacturing DRAM (Specifically forming a silicide layer 107a, a low impurity concentration N-type diffusion layer 110 and a high impurity concentration N-type diffusion layer 113) according to the second embodiment of the present invention.
Figure 14B:
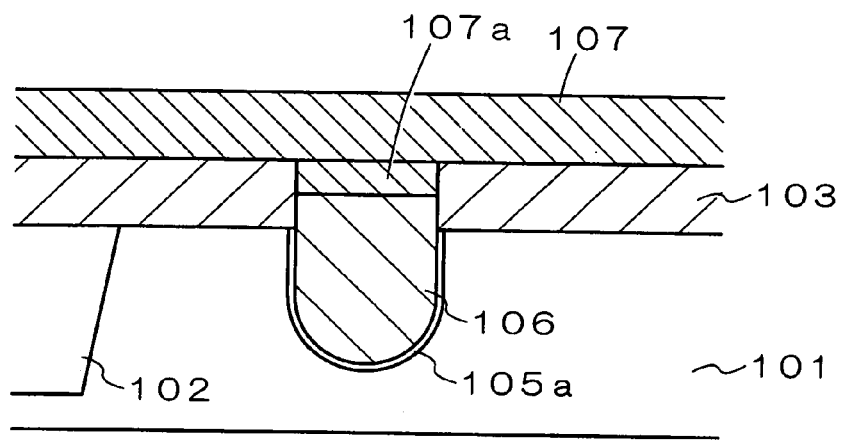
Figure 14C:
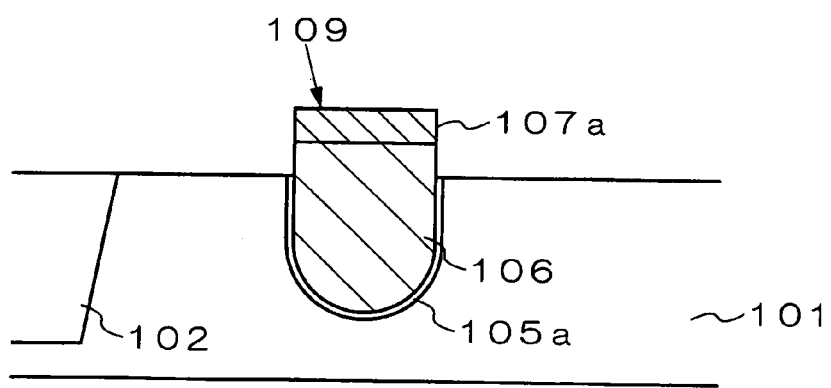

Then, as shown in FIG. 14A, refractory metal film 107 composed of tungsten (W), cobalt (Co), titanium (Ti), or nickel (Ni) is deposited by sputtering on the entire surface of the substrate. Annealing is then performed, and the refractory metal film 107 and the polysilicon film 106 are reacted with each other to form a silicide layer 107a on the surface layer portion of the polysilicon film 106, as shown in FIG. 14B. Then, as shown in FIG. 14C, the excess refractory metal film 107 that did not react with the polysilicon film 106 is removed by wet etching using sulfuric acid, hydrochloric acid, or the like, and the silicon nitride film 103 is removed by using hot phosphoric acid ($H_3PO_4$). A gate electrode 109 composed of the polysilicon film 106 and the silicide layer 107a is thus created according to the process described above. The silicon nitride film 103 used to form the gate trench 104 is thus used without modification as the mask for forming the gate electrode, and when the gate electrode 109 is formed in self-matching (self-aligning) with respect to the gate trench 104, misalignment of the gate electrode 109 can be prevented.

Figure 15A:
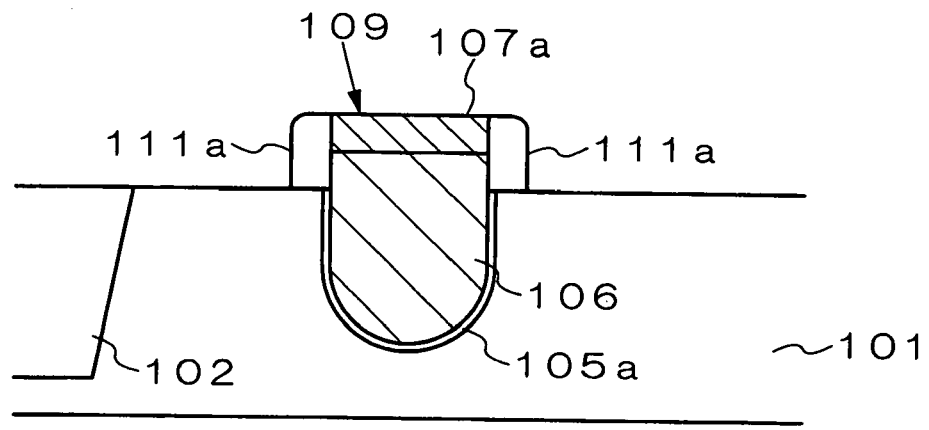
FIG. 15A is a schematic cross sectional view showing the process for manufacturing DRAM (Specifically forming a side wall insulating film 111a) according to the second embodiment of the present invention.
Figure 15B:
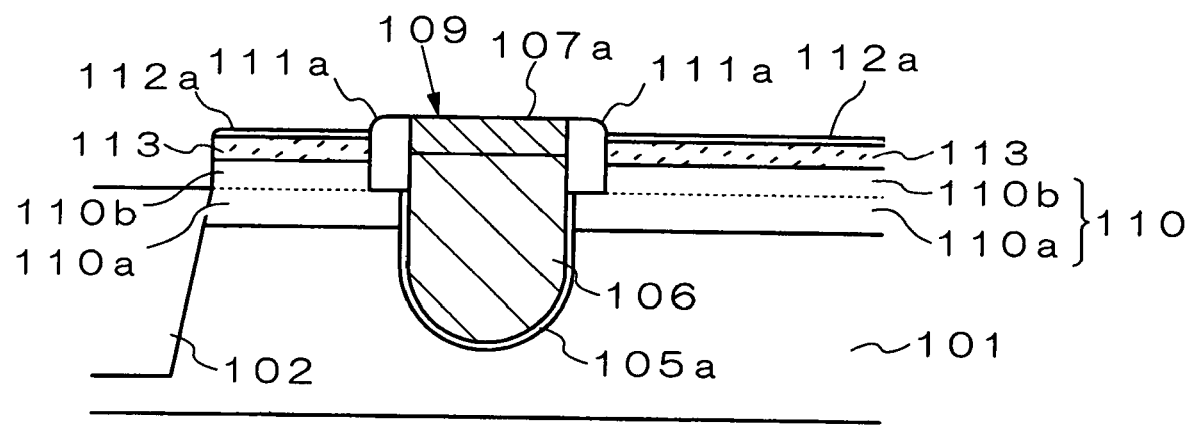
FIG. 15B is a schematic cross sectional view showing the process for manufacturing DRAM (Specifically forming a silicon epitaxial layer 112) according to the second embodiment of the present invention.
Figure 16:
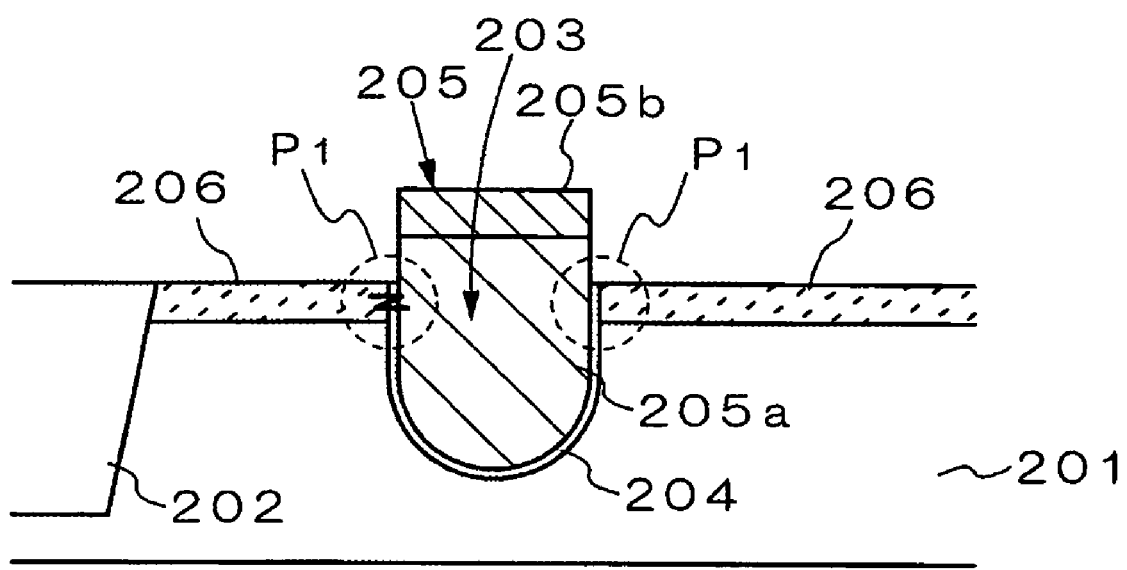
FIG. 16 is a schematic cross sectional view showing an example of the structure of the conventional trench-gate-type transistor.

Then, after a new silicon nitride film is deposited on the entire surface of the substrate, the silicon nitride film is etched back so as to remain only in the lateral surface portion of the gate electrode 109, and the side wall insulating film 111a is formed as shown in FIG. 15A. Subsequent steps are the same as in the first embodiment, wherein the low impurity concentration diffusion layer 110 that serves as the source/drain region is formed in the silicon substrate 101; the silicon epitaxial layer 112 is formed on the region in which the low impurity concentration N-type diffusion layer 110 is formed; the low impurity concentration N-type diffusion layer 114 and the high impurity concentration N-type diffusion layer 113 are formed in the lower layer and upper layer, respectively, of the silicon epitaxial layer 112; and the trench-gate-type transistor is completed as shown in FIG. 15B. The high impurity concentration N-type diffusion layer 113 is thus formed in a position that is aligned against the side wall insulating film 111a, and a structure is obtained in which the high impurity concentration diffusion layer 113 and the gate electrode 109 are insulated from each other by the side wall insulating film 111a. The thickness of the side wall insulating film 111a in the width direction thereof is about 20 nm, which is adequately thick compared to the gate insulating film 105a, and the high impurity concentration diffusion layer 113 and the gate insulating film 105a are adequately separated from each other in the vertical direction. Therefore, the risk of electric breakdown resistance defects is extremely low.

The trench-gate-type transistor of the present embodiment is thus completed.

Various types of wiring and cell capacitors are then layered using a common method in DRAM manufacturing. Specifically, DRAM that is substantially the same as in FIG. 8 is completed by forming an interlayer insulating film 114 on the cell transistor, a contact plug 115 that pass through the interlayer insulating film 114, a bit line 116, a cell capacitor 117, Al wiring 118, and other components.

As described above, since the high impurity concentration diffusion layer 113 that serves as the source/drain region of the cell transistor is formed so as to be aligned against the side wall insulating film 111a, and is adequately separated from the gate insulating film 105a according to the present embodiment, junction leakage can be prevented, and a recess channel transistor having good characteristics can be manufactured. It is therefore possible to manufacture high-quality and high-density DRAM by using this product as a DRAM cell transistor.

Another feature of the present embodiment is that misalignment of the gate electrode 109 can be prevented when the silicon nitride film 103 used to form the gate trench 104 is used without modification as the mask for forming the gate electrode, and the gate electrode 109 is formed in self-matching (self-aligning) fashion with respect to the gate trench 104. Fluctuation of transistor characteristics, such as threshold voltage (Vt) or ON current, caused by misalignment of the gate electrode can therefore be suppressed.

Several preferred embodiments of the present invention were described above. However, the present invention is not limited to the embodiments described above, and it is possible to make various modifications within a scope that does not depart from the spirit of the present invention, and such modifications naturally are included in the scope of the present invention.

For example, a region in the silicon substrate and a low impurity concentration diffusion layer in the epitaxial layer are formed in order to form the source/drain region in the embodiments described above. However, it is not necessarily required that a low impurity concentration diffusion layer be formed in the present invention. Particularly in the second embodiment, there is no misalignment of the gate electrode, and it is therefore sufficient if a high impurity concentration diffusion layer is formed in the epitaxial layer without forming a region in the silicon substrate and a low impurity concentration diffusion layer in the epitaxial layer in order to form the source/drain region.

In the above embodiments, a silicon nitride film is formed as a protective insulating film directly on the surface of the P-type silicon substrate. However, a silicon oxide film having a thickness of about 10 to 20 nm may be formed as a buffer layer on the surface of the P-type silicon substrate, and a silicon nitride film may be formed via this silicon oxide film. Furthermore, a polysilicon film or another type of material besides a silicon nitride film may be used as the protective insulating film.

In the above embodiments, the element separation region is formed by an STI method. However, the present invention is not limited to this method, and a LOCOS method or other method may of course be used.

In the above embodiments, the polysilicon film 106 is polished by CMP when the polysilicon film 106 is caused to remain only in the gate trench 104. However, it is also possible to remove the polysilicon film 106 by etching.

The gate electrode 109 also has a layered structure that includes the polysilicon film 106, the silicon nitride film 108, and other layers in the embodiments described above. However, the gate electrode 109 may also have a single-layer structure composed only of the polysilicon film 106, for example.

Examples were also described in the abovementioned embodiments of a case in which the present invention is applied to an N-channel MOS transistor that uses a P-type silicon substrate. However, the present invention is not limited to this configuration, and may also be applied to a P-channel MOS transistor. A P-well or an N-well may also be formed as needed. Furthermore, DRAM is used as an example of the semiconductor device in the abovementioned embodiments, but the present invention is not limited to this configuration, and can be applied to the manufacture of any semiconductor device that has a trench-gate-type transistor. However, the present invention has significant effects in DRAM in terms of enabling miniaturization of a transistor cell array.

What is claimed is:

1. A semiconductor device, comprising:
a semiconductor substrate having an upper surface;
a groove formed in the semiconductor substrate;
a gate insulating film formed on an inner wall of the groove;
a gate electrode having a first portion formed on the gate insulating film in the groove and a second portion that protrudes from the first portion to such a level that is higher than the upper surface of the semiconductor substrate;
a side wall insulating film for covering the lateral face of the second portion of the gate electrode; and
an epitaxial layer formed on the upper surface of the semiconductor substrate adjacent to the side wall insulating film,
wherein the epitaxial layer comprises an upper layer and a lower layer,
the upper layer includes a source/drain region, and
the lower layer includes a first LDD region that is lower in impurity concentration than the source/drain region.

2. The semiconductor device as claimed in claim 1 further comprises a second LDD region in contact with the first LDD region and formed near the surface of the semiconductor substrate.

3. The semiconductor device as claimed in claim 1, wherein a gate insulating film is formed under the side wall insulating film.

4. The semiconductor device as claimed in claim 1, wherein the source/drain region and the first LDD region are arranged in a direction substantially orthogonal to the substrate surface of the semiconductor substrate.

5. The semiconductor device as claimed in claim 1, wherein the source/drain region and the gate insulating film are separated by at least the first LDD region.

6. The semiconductor device as claimed in claim 2, wherein the source/drain region and the gate insulating film are separated by the first and second LDD regions.

7. A semiconductor device, comprising:
a semiconductor layer having an upper surface;
a groove formed in the semiconductor layer;
a gate insulating film formed on an inner wall of the groove;
a gate electrode having a first portion formed on the gate insulating film in the groove and a second portion that protrudes from the first portion to such a level that is higher than the upper surface of the semiconductor layer;
an insulating film covering a lateral face of the second portion of the gate electrode in contact with a first part of the upper surface of the semiconductor layer; and
an epitaxial layer formed on a second part of the upper surface of the semiconductor layer in contact with a lateral face of the insulating film, the insulating film being between the epitaxial layer and the second portion of the gate electrode, wherein:
the epitaxial layer comprises an upper layer and a lower layer that is between the upper layer and the second part of the upper surface of the semiconductor layer, the upper layer being in contact with a part of the lateral face of the insulating layer and the lower layer being in contact with another part of the lateral face of the insulating layer,
the upper layer includes a source/drain region, and
the lower layer includes a first LDD region that is lower in impurity concentration than the source/drain region.

8. The device as claimed in claim 7 further comprising a second LDD region formed in the semiconductor layer, the second LDD region including the first and second portions of the semiconductor layer.

* * * * *